United States Patent [19]

Gupta et al.

[11] Patent Number: 5,325,388
[45] Date of Patent: Jun. 28, 1994

[54] OPTOELECTRONIC WAVEGUIDE NEURAL ARCHITECTURE

[75] Inventors: Neelam Gupta, Silver Spring, Md.; Charles Garvin, Boulder, Colo.; George Simonis, Silver Spring, Md.

[73] Assignee: The United States of America as represented by the Secretary of the Army, Washington, D.C.

[21] Appl. No.: 57,140

[22] Filed: May 5, 1993

[51] Int. Cl.⁵ ............................................. H01S 3/19
[52] U.S. Cl. ...................................... 372/50; 372/46; 372/45
[58] Field of Search .......................... 372/46, 45, 50

[56] References Cited

U.S. PATENT DOCUMENTS

| | | | |
|---|---|---|---|
| 4,286,230 | 8/1981 | Morrison et al. | 331/79 |
| 4,331,934 | 5/1982 | Morrison et al. | 331/79 |
| 4,545,056 | 10/1985 | Wortman et al. | 372/2 |
| 4,571,726 | 2/1986 | Wortman et al. | 372/2 |
| 4,590,596 | 5/1986 | Wortman et al. | 372/2 |
| 4,721,362 | 1/1988 | Brody et al. | 350/320 |
| 4,811,325 | 3/1989 | Sharples, Jr. et al. | 369/85 |
| 4,813,051 | 3/1989 | Taneya et al. | 372/50 |
| 4,829,527 | 5/1989 | Wortman et al. | 372/2 |
| 4,921,333 | 5/1990 | Brody et al. | 350/320 |
| 4,996,430 | 2/1991 | Gupta | 250/339 |
| 5,022,036 | 6/1991 | Suyama et al. | 372/45 |
| 5,047,822 | 9/1991 | Little, Jr. et al. | 357/30 |

Primary Examiner—Georgia Y. Epps
Attorney, Agent, or Firm—Saul Elbaum; Frank J. Dynda

[57] ABSTRACT

GaAs base optical waveguide-based structure for a neural network is disclosed which may form the basic functional building block of a neural architecture in which the waveguide architecture contains at least three electrically active components which are electrically isolated from each other. The waveguide parameters are such that the laser light propagating through the waveguide is a single-mode in both transverse and lateral directions. A superlattice structure is incorporated in the waveguide core and results in electroabsorption of the input laser light. An electric field is supplied to the active components in order to change the transmission properties of the core material, thus modulating the light passing through the core material.

14 Claims, 3 Drawing Sheets

OPTOELECTRONIC WAVEGUIDE NEURAL ARCHITECTURE

RIGHTS OF THE GOVERNMENT

The invention described herein may be manufactured, used and licensed by or for the U.S. Government for governmental purposes without the payment to me of any royalty thereon.

BACKGROUND OF THE INVENTION

The present invention relates generally to an optical implementation of a neural network for optical processing data. More particularly, the present invention relates to an optoelectronic neural network device which is compact and monolithic and which can provide flexible processing of data in optical form.

It is often desirable to be able to readily recognize patterns. Pattern recognition is a function which is important in both military and commercial applications, such as aided target recognition, speech recognition, machine recognition of handwriting, robotic vision, communications systems, automated control, design and manufacturing, radar data analysis, and other areas. At the present time, the most outstanding system for performing pattern recognition is the human brain which can recognize a pattern, even with partial or incomplete information and even in relatively ill-defined situations. Digital computers, which are capable of very fast number manipulation and other serial operations, are very inefficient in performing pattern-recognition tasks. In order to use a digital computer for performing pattern-recognition tasks, an enormous memory would be required, as well as a very large knowledge base and a rule-based expert system. Even so configured, such an electronic computer would only be able to perform relatively simple pattern-recognition tasks.

Current investigation of brain functions has contributed to artificial neural networks technology which is based upon the knowledge of how a biological brain functions as a parallel processor. A biological brain uses a large number of relatively simple but slow (millisecond range) processing elements or neurons which work in concert with each other with a massive number of interconnections. Such neural networks can be used to perform processing at several levels of pattern-recognition problems, including input data preprocessing, such as data recovery, noise removal, signal-to-noise-ratio (SNR) enhancement, signal and/or image segmentation through final target identification. Both electronic and optical approaches to hardware implementations of neural networks have been proposed.

Most of the optical implementations of neural networks have been based upon the use of a vector-matrix multiplication technique to simulate neural functioning. Most of those implementations utilize a free-space architecture and require many optical components which cannot be monolithically integrated. The present invention, on the other hand, implements optical neural architecture in GaAs materials which is very compact and monolithic and is inspired by the natural fiber-like structures common in all biological neurons. Utilizing the technology of semiconductor quantum wells and superlattices, which may also be used for optical modulators and switches, the present invention emulates the basic neural decision-making process of the human brain. Multiple inputs are accepted, different adjustable weights are applied to those inputs, the weighted inputs are summed, and then an optoelectronic thresholding switch is used to make a binary decision.

Biological brain systems appear to be successful due to their complex and massively parallel architectures. For example, a 3 pound human brain consists of over 10 billion neuron cells communicating among themselves through networks of over 100 trillion synaptic interconnections. Each neuron has a relatively simple structure and functioning method. Typically, a neuron consists of a cell body, ranging from about 5 to 100 microns in diameter, from which one major fiber, the axon, and a number of fibrous branches, the dendrites, emanate. The axon carries the outgoing signal from the neuron, and, near its end, it usually branches out extensively.

The dendrites receive the input signals from other neurons, where they form a contact, called a synapse. A weight is applied to each signal, and the cell body sums those weighted signals and then performs a simple thresholding operation based on that sum to determine whether to send a signal on to its axon or not. Generally speaking, a single neuron receives input from thousands of other neurons through its dendrites and similarly feeds its output to thousands of other neurons through its branching axon. The time scale involved, however, is relatively slow, being in the range of milliseconds.

An artificial neuron network consists of a massively interconnected network of processing elements. For purposes of mathematical simplification, such a network is divided into a number of layers; each layer is made up of a number of neurons or nodes. Every neuron in each of those layers is connected to every neuron in the next layer for a network that is fully connected. Alternatively, the number of connections could be less, depending upon the application. Every neural network, however, has an input and an output neural layer. There can also be some additional layers in between those two, which are known as hidden layers.

The operating principle of a neural network can be mathematically represented by a nonlinear function f, as set forth by R. P. Lippmann in "An introduction to computing with neural nets", IEEE ASSP Magazine, vol. 4 (April 1987).

While both electronic and optical approaches to the hardware implementation of neural networks are being used, optical implementations appear to have a very promising future because of the inherent parallelism of light. Most of the architecture suggested in the art by, for example, N. H. Farhat, "Optoelectronic neural networks and learning machine", IEEE Circuits and Devices Magazine, vol. 32 (September 1989); D. Psaltis, D. Brady, X. Gu, and K. Hsu, "Optical implementation of neural computers", Optical Processing and Computing, H. A. Arsenault, editor, chapter 8 (1989); Y. Nitta, J. Ohita, M. Takahashi, S. Tai, and K. Kyuma, "Optical neurochip with learning capability", Photonics Tech. Lett., vol. 4, No. 3, page 247 (1992), contain at least three planes. The first plane, corresponding to the input neurons, contains an array of discrete sources of light (either one- or two-dimensional), for example, spatial light modulators (SLM's) or light-emitting diodes.

The second layer contains a two-dimensional array of interconnection elements representing the weight matrix, for example, an SLM (either fixed or programmable) or a hologram (two-dimensional or volume). The third layer corresponds to the output neurons and contains an array of discrete photodetectors for summing the weighted inputs with a built-in quadratic nonlinearity. Sometimes an additional thresholding is provided at this stage using electronics or some other scheme. Some approaches also include the use of hidden layers. While most of those implementations are of the tabletop-type size, this type of architecture has recently been implemented in GaAs by Y. Nitta et al.

The present invention, in contrast, is an optical implementation of a feed-forward neural network architecture which is implemented in a monolithic GaAs/AlGaAs waveguide structure, in which both the weighting and thresholding are provided by the room-temperature macroscopic nonlinear behavior of an embedded superlattice by the application of small electric voltages.

SUMMARY AND OBJECTS OF THE INVENTION

In view of the foregoing, it should be apparent that there still exists a need in the art for an optical neural network device which can be easily implemented and which can be used as the building blocks of neural networks. It is, therefore, a primary object of this invention to provide a design for an optical neural network device architecture which can be easily implemented in existing solid-state materials and which can be formed into components such as discrete sources of light, interconnections, and weighting, summing, thresholding, and output signals.

More particularly, it is an object of this invention to provide an optical neural network structure which can be formed such that it contains components which function as laser diodes, low-loss, single-mode rib waveguides, power combiners and splitters, modulators, thresholding devices, and detectors.

Still more particularly, it is an object of this invention to provide an optoelectronic waveguide neural structure which can be assembled into a complex optical neural network.

Briefly described, these and other objects of the invention are accomplished by providing a GaAs-based optical waveguide-based structure for a neural network. The sources of light used with the neural network are laser diodes. The light is coupled into a waveguide power combiner structure. The waveguide architecture contains at least three electrically active components which are electrically isolated from each other. The waveguide parameters are chosen so that the light propagating through the waveguide is single-mode in both transverse and lateral directions. A superlattice structure is incorporated in the waveguide core and gives rise to electroabsorption. As each of the input signals passes through the device, an electric field is applied to change the transmission properties of the core material, and the light passing through the core material is thus modulated.

The output guide of the power combinet sums the weighted signals coming from various input guides. It also contains a nonlinear switch in which the waveguide section acts both as a detector and a modulator. The nonlinear switch output depends upon the amount of light passing through it; for a higher intensity of light, its transmission is very high, while, for a low intensity of light, it is very low.

The power combiner of the present invention forms the basic functional building block of the disclosed neural architecture. A more complex structure can be formed by cascading many such building blocks together. The optoelectronic neural waveguide structure of the present invention has implemented within its design several integrated optical components, such as low-loss, single-mode rib waveguides, Y-junctions, crossing waveguides with various angles of crossing, modulators, and nonlinear switches. All of those components have been monolithically integrated in solid-state materials.

The present invention has been successfully implemented in the design of a two-input/one-output (2-to-1) neuron and may be expanded to include more complex single neurons in a neural network. It may be utilized to implement a very-high-dynamic-range (250 dB/cm) optoelectronic modulator, as well as a highly nonlinear optoelectronic (25 dB) thresholding device. A very high on/off ratio of 2300 has been obtained for the inventive neuron device.

With these and other objects, advantages, and features of the invention that may become hereinafter apparent, the nature of the invention may be more clearly understood by reference to the following detailed description of the invention, the appended claims, and to the several drawings attached herein.

DETAILED DESCRIPTION OF THE PREFERRED EMBODIMENT

Figure 1:
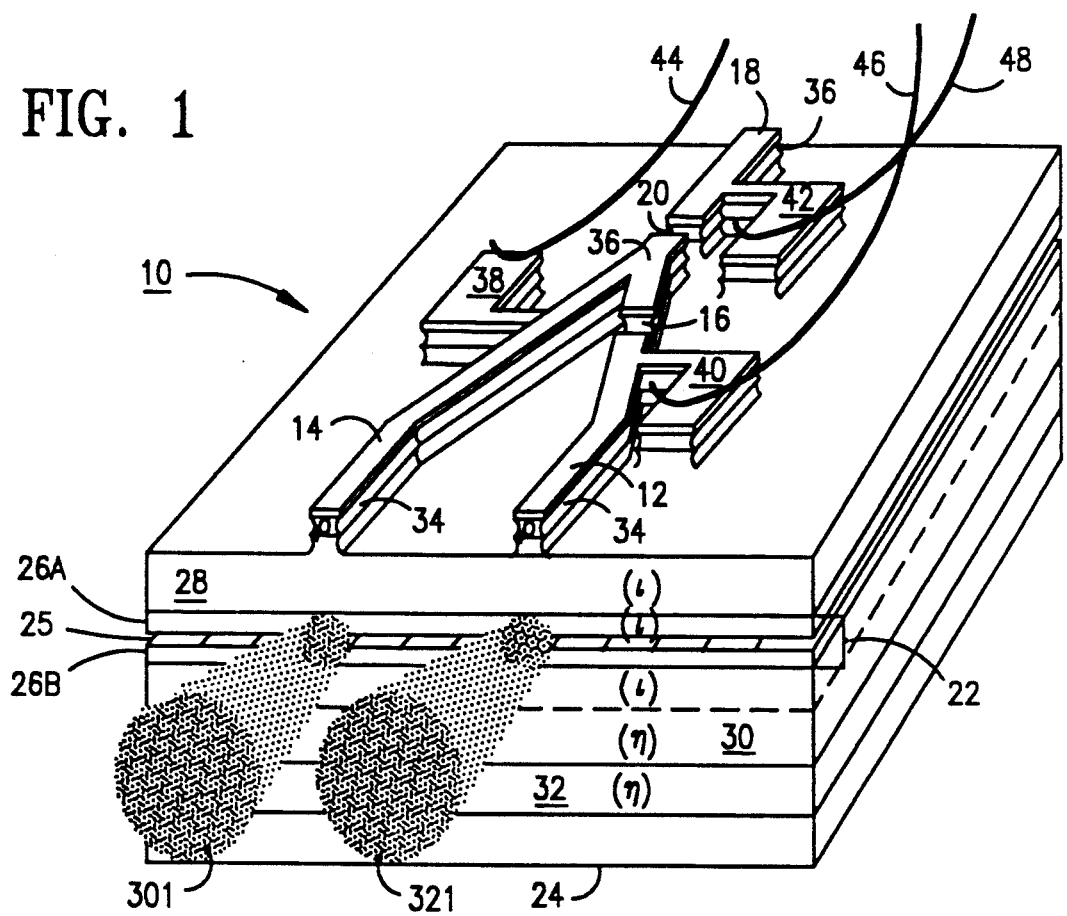
FIG. 1 is a perspective drawing showing the apparatus of the present invention.

Referring now in detail to the drawings wherein like parts are designated by like reference numerals throughout, there is illustrated in FIG. 1 a specific embodiment of an N-to-1 rib waveguide power combiner structure of the present invention, namely, a 2-to-1 power combiner 10 which can be a small angle Y-junction. The architecture of the combiner 10 includes at least three electrically active components. In the preferred embodiment, two modulators 12 and 14 are utilized which form the arms of the Y-junction. They are electrically isolated from each other by a first cut 16. The third electrically active component of the Y-junction combiner 10 is a thresholding element 18 which is formed by the tail of the Y-junction and which is electrically separated from the two modulators 12 and 14 by a second cut 20.

In recent years, advances in III-V optoelectronics research have been particularly rapid in the area of semiconductor laser diodes, detectors, modulators, amplifiers, and switches. The ability to grow thin (<10 nm) high-quality layers of compound semiconductors using molecular-beam epitaxy (MBE) has led to the discovery of several new optical and electrical phenomena and the ability to create devices that exploit such phenomena. For example, novel optoelectronic devices that depend upon quantum mechanical phenomena have been demonstrated. One such phenomenon is the quantum well which is a thin heterostructure of a low-bandgap material, such as GaAs, sandwiched between two layers of a higher bandgap material, such as AlGaAs, in order to form an electron well. The thickness of the low-bandgap material is preferably around 30 atomic layers or approximately 10 nm. D. A. B. Miller, in "Optoelectronic applications of quantum wells", *Opt. Photonics News*, vol. 7 (February 1990), and in "Quantum-well self-electro-optic effect devices", *Opt. Quantum Electron*, vol. 22, S61 (1990), has reported that large changes in optical absorption due to single and multiple quantum wells in the presence of an external electrical field have given rise to new optical modulators and switching devices. Attention has also been focused on a periodic structure of very thin quantum wells of width around 3 nm, which are separated by layers of similar width of higher bandgap material. Such a structure of coupled quantum wells is called a superlattice (SL).

Such superlattices show very strong macroscopic nonlinear effects at room temperature due to quantum mechanical effects. In such a structure, the electrons and holes are not localized, that is, the energy band structure is continuous. Thus, when an electric field is applied, that continuous band structure breaks up into a series of minibands known as the Stark ladder. The separation between those levels depends directly upon the applied field, the period of the superlattice and the electronic charge. When such a structure is illuminated by light, the absorption of light corresponding to those miniband transitions takes place. That makes the superlattice absorb light at wavelengths to which it was transparent in the absence of the applied electric field.

Below-gap voltage-modulated absorption devices can also be made when those transitions are made to coincide with the incident photon energy. Using materials engineering, various functional capabilities can be constructed using such structures. For example, if the layer thickness or the potential well depths are changed, devices with very different operating characteristics will be created. Very-high-dynamic range modulators have been designed using such superlattices.

The material structure of the electrooptic waveguide power combiner 10 of the present invention is a GaAs/AlGaAs structure which was grown using molecular-beam epitaxy techniques. It is grown in a p-i-n heterostructure waveguide configuration, as shown in FIG. 1. The core of the waveguide 22 is undoped. It is formed of a preferably 52.5 nm thick superlattice 25 having a layer of $Al_{0.2}Ga_{0.8}As$ (n=3.53) with a layer 26 of preferably 100 nm thickness on either side. The 10-period superlattice 25 contains alternate layers of 2.5-nm GaAs and 2.5-nm $Al_{0.4}Ga_{0.6}As$. A top cladding region 28 is formed on top of the top core layer 26a and is a region of $Al_{0.4}Ga_{0.6}As$ (n=3.39) layer of preferably 500 nm thickness. Of the 500 nm of thickness of the upper cladding layer 28, the first 125 nm next to the core 22 are undoped and the remainder of the layer 28 is p-doped.

The bottom cladding region 30 consists of a layer of the same material as the upper cladding region 28 except that it is preferably of a thickness of 1250 nm. The first 125 nm of the bottom cladding region 30 next to the core 22 consists of an intrinsic layer, while the rest is n-doped. It is preferred that the doping levels be around $10^{18}/cm^3$. Such layers may be grown on an n+-doped GaAs substrate 24 on which an n-doped preferably 1000-nm GaAs buffer 32 has first been grown.

A cap of p+ GaAs material of preferably 50-nm thickness is formed on top of the upper cladding layer 28. Thus, a p-i-n diode structure is formed which is very useful in applying an external electric field to the waveguide core 22.

The doping of the combiner 10 is spaced back from the core region 22 in order to reduce free-carrier-induced losses for the propagating optical mode. The thickness of the core region 22 may be chosen in order to produce a single transverse electric or transverse magnetic propagation mode at a 780-nm wavelength in the transverse direction. Using photoluminescence measurements, the bandgap of this material has been found to be 1.75 eV or 708 nm.

Figure 5:
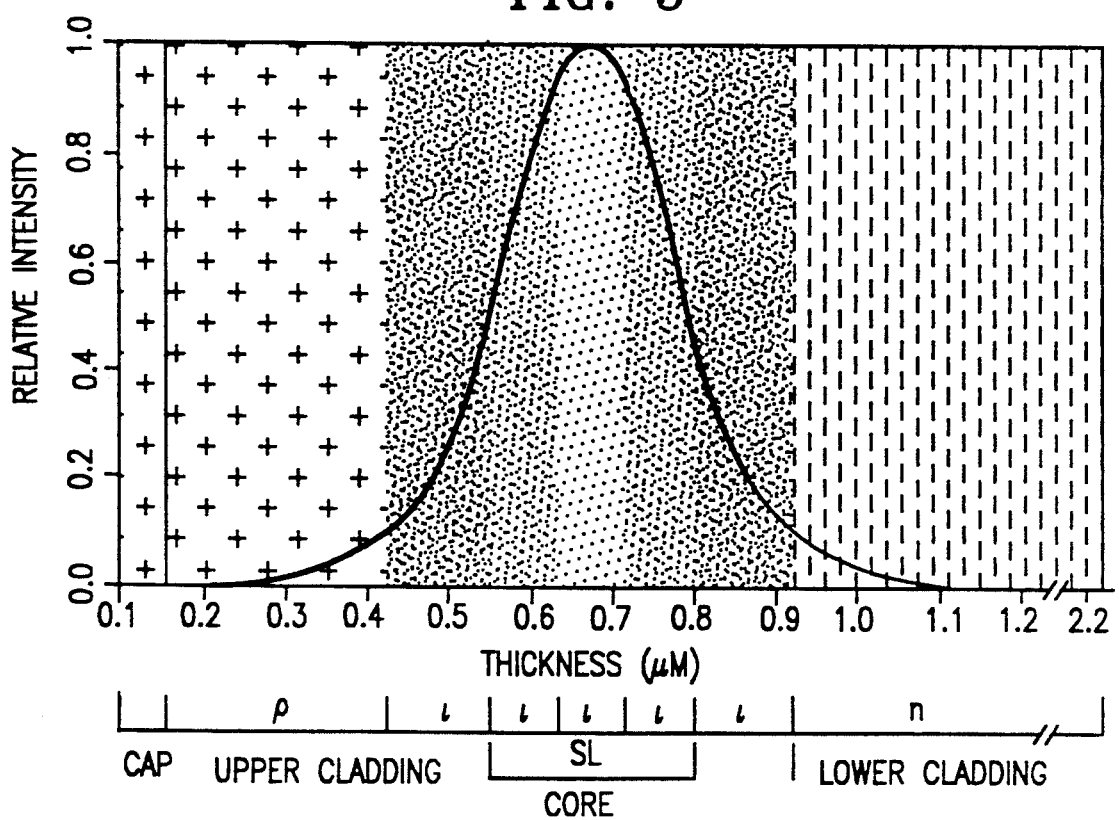
FIG. 5 is a drawing of a profile of a single transverse mode in a waveguide core of the apparatus of the present invention, showing how intensity of light is distributed as a function of the thickness of the waveguide.

FIG. 5 is a diagram of the profile of a single transverse mode in the preferred waveguide core of the present invention and shows how the intensity of light is distributed as a function of the device thickness. The core and cladding regions are shown with their doping profile.

On top of the cap 34, a layer 36 of gold/chromium of preferably 300 nm thickness is formed. A plurality of bonding pads 38, 40, and 42, formed of the same material, are connected by 10-micron-wide conducting channels to one of the electrically isolated modulators in the thresholding elements 14, 12, and 18, respectively. Each of the bonding pads 38, 40, and 42 may preferably be of a dimension of 100 microns×200 microns.

Each of the arms 12, 14 and leg 18 of the Y-junction is fabricated as a 5-micron-rib waveguide. The preferred fabrication technique utilizes a photolithography process to pattern a resist mask on the molecular-beam epitaxy-grown material. A 300 nm layer of chrome/gold film is deposited using electron-beam evaporation through the developed resist and then the undesired chrome/gold is lifted off by developing the resist. The rib pattern is then etched by using a standard GaAs chemical etching, with the metallization providing the electrode in the self-aligned mask.

Figure 2:
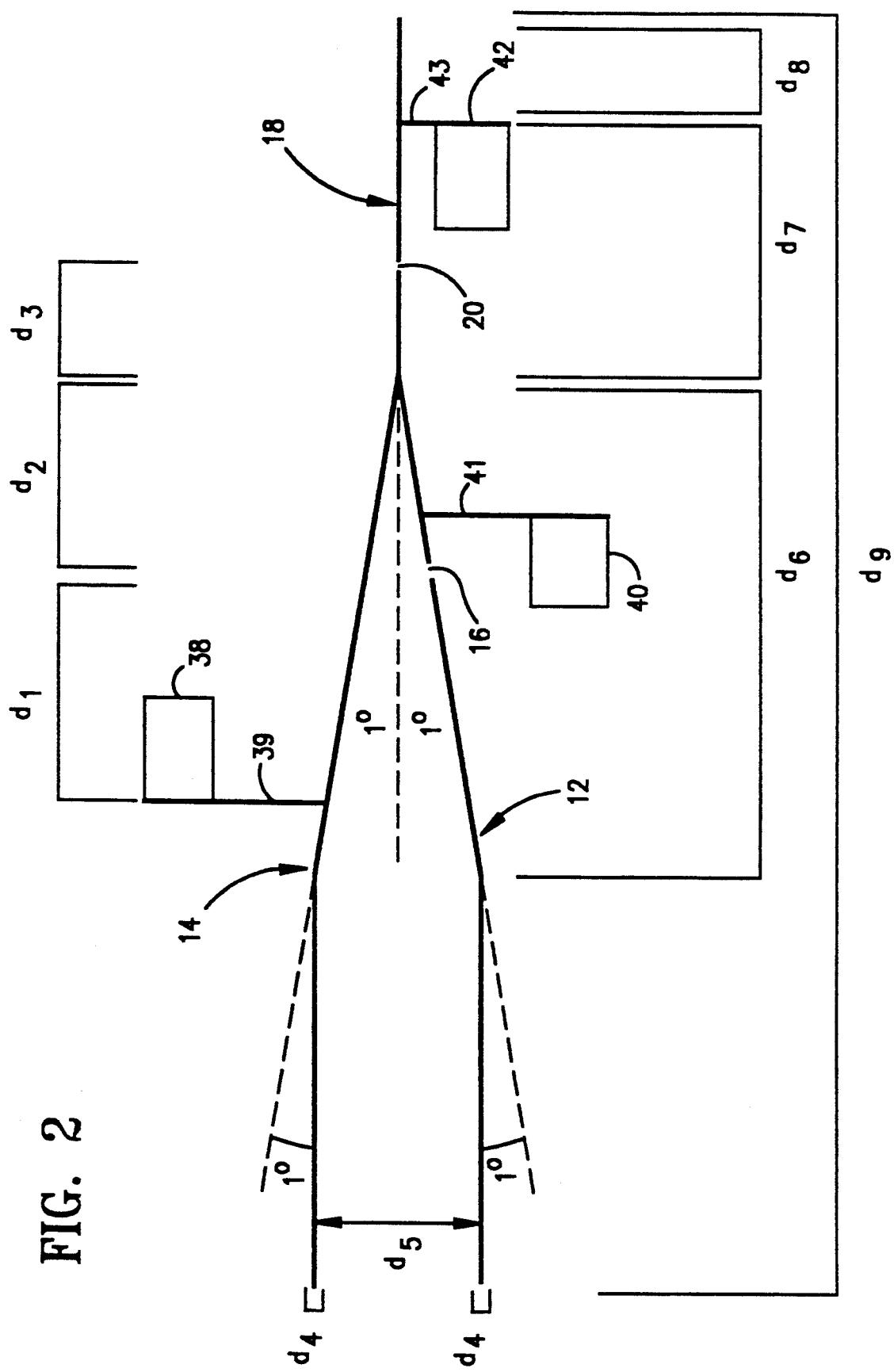
FIG. 2 is a schematic diagram of a geometric layout optoelectronic waveguide structure of the present invention showing the dimensions of the various parts of the waveguide structure.

A geometric layout showing the dimensions of the various parts for the preferred embodiment of a 2-to-1 waveguide neuron structure of FIG. 1 is shown in FIG. 2. As previously discussed, each of the leg portions 14 and 12 of the Y-junction are formed as 5-micron (d4) wide rib waveguides, as is the tail portion 18. The two legs 12 and 14 of the Y-junction may preferably be spaced 50 microns (d5) away from each other. Each of the modulators 12 and 14 and the thresholding element 18 are electrically isolated by two gaps or cuts 16 and 20 which may preferably be of dimensions of about 3 microns×5 microns.

Each of the legs 12, 14 of the Y-junction are formed at an angle 1° offset from an imaginary center line passing between them which is aligned with the end portion 18 of the Y-junction. Each of the conducting channels 39, 41, and 43 which respectively connect the bonding pads 38, 40, and 42 to their respective portions of the combiner 10 may preferably be about 25 microns long. Each of the bonding pads 38, 40, and 42 has connected to it a wire 44, 46, and 48 for applying an electric current. Table 1 shows each of the dimensions d1-d9 for the 2-to-1 optical neuron structure of FIG. 2.

TABLE 1

| d1 | 700 microns | d6 | 1.43 mm |
|---|---|---|---|
| d2 | 400 microns | d7 | 700 microns |
| d3 | 200 microns | d8 | 500 microns |

TABLE 1-continued

| d4 | 5 microns | d9 | 4.03 mm |
|---|---|---|---|
| d5 | 50 microns | | |

As shown above in Table 1, the optical neuron device of FIG. 2 may preferably be about 4 mm long, and a chip may be fabricated containing, for example, ten such neuron devices. The height of each rib wall which forms the raised Y-junction on the cladding layer 28 may preferably be about 550 nm, which provides enough electrical isolation for each of the active elements 12, 14, and 18 of the combiner 10 but makes the combiner 10 multimode in the lateral direction, thus degrading the signal-to-noise ratio slightly.

The isolating gaps 16 and 20 may be formed by including two cuts preferably of dimensions 3 microns×5 microns in the Y-junction mask which, as described above, produces during the etching process the gaps or breaks 16 and 20 which are needed to electrically isolated the three active components 12, 14, and 18. The entire chip containing, for example, ten such combiners 10, is cleaved at both ends in order to provide optical-quality coupling facets. The chip may be mounted on a conducting holder which acts as the bottom n-contact. P-contacts are provided by the top gold layer previously discussed.

The chip is mounted on the holder with pins. Gold wires 44, 46, and 48 of preferably about 25 microns in thickness are bonded to the p-contacts as well as to the n-contacts (not shown) so that such contacts can be connected to pins for electrical access to each combiner 10.

Figure 3:
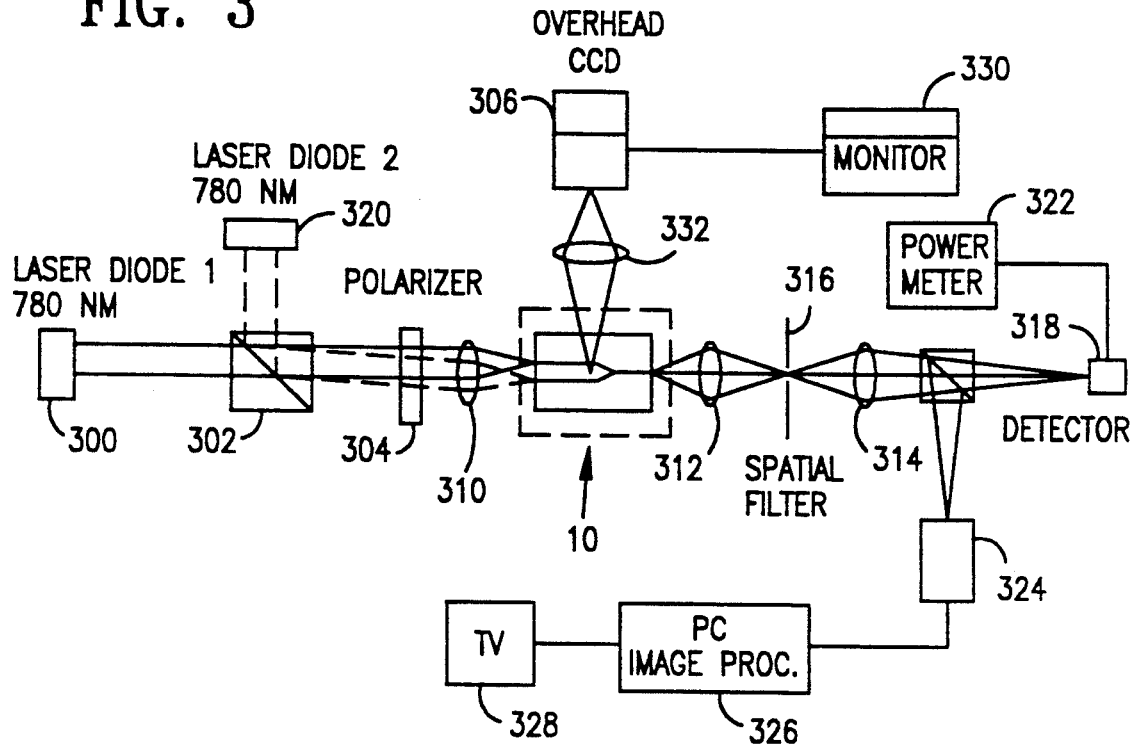
FIG. 3 is a schematic block diagram of an optical neuron measurement system for testing the device of the present invention.

FIG. 3 shows a system for operating and testing the optical combiner 10 of FIG. 1. First and second laser diodes 300 and 320, respectively, each being totally incoherent with each other and producing a beam of light having a wavelength of 780 nm are end-fire coupled into the two input guides of the combiner 10 using a 40× microscope objective 310 to focus the two incoming beams of light. The light from both laser diodes 300 and 320 passes through a beam splitter 302 and a polarizer 304 prior to the microscope objective 310. By choosing suitable position alignments for each of the two lasers 300 and 320, the two focussed spots which strike the core of the waveguide device 10 are separated by 50 microns.

Only the transverse electric polarized light striking the core 22 is coupled to the waveguide 10. The output of the waveguide device 10 is collected by a 10× microscope objective 312 and focussed onto a spatial filter 316. The light is next focussed by a lens 314 onto a detector 318 which is connected to a power meter 322. The light striking the detector 318 is also focussed onto a charge-coupled device (CCD) camera 324. The image produced by the CCD camera 324 is processed using a micro-computer which contains a frame-grabber card and image-processing software. The spatial filter 316 is used to block out light not coming from the waveguide 10 prior to that light reaching the detector 318 and the CCD camera 324.

A second CCD camera 306 is positioned together with a microscope objective 332 for use for viewing the top of the waveguide device 10 and is useful for positioning and aligning the laser inputs from the laser diodes 300 and 320.

The electrical voltages to be applied to the waveguide 10 may be provided using a 4-wire cable, which is connected to the contact pins on the sample holder. (The fourth wire, which is connected to the bottom n-contact is not shown.) An electronic bias circuit is utilized which limits the current flowing in each of the three components 12, 14, and 18 to 70 microamps.

The positioning requirements for the optical coupling of the laser beams produced by the laser diodes 300 and 320 are demanding because each focus spot has to be coupled into a 5 microns×0.25 micron region on the input facet of the waveguide. Therefore, a piezoelectric transducer three-axis controller is used for fine position alignment of the waveguide 10. A monitor 330 is used to view the output from the CCD camera 306 while a television 328 is used to view the image produced by the micro-computer/frame-grabber 326.

Figure 4:
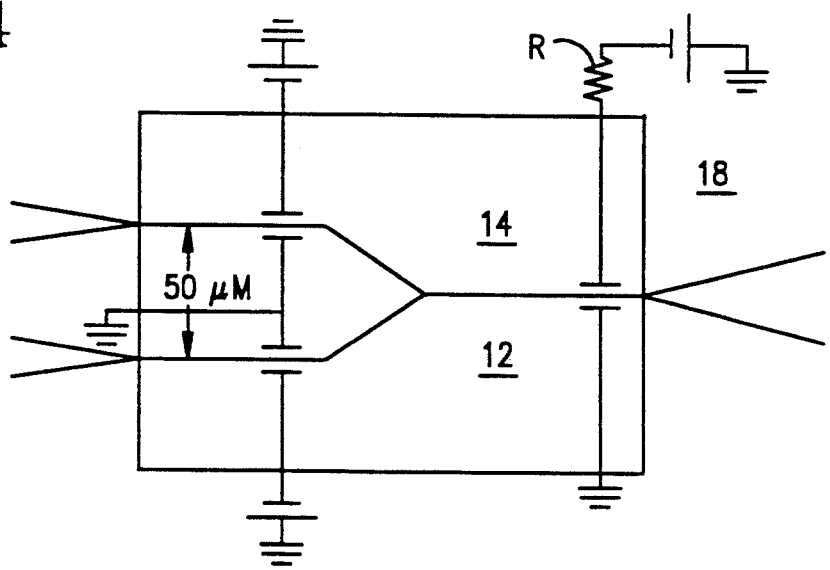
FIG. 4 is a partial electrical schematic diagram of the apparatus of the invention shown in FIG. 1.

FIG. 4 shows an electrical schematic of the electrical circuit for each of the three active electrical components of the optical waveguide 10.

Upon measuring the output intensity of the modulators 12 and 14 as a function of the applied bias, it has been determined that they transmit less light as the reverse-bias voltage is increased. That is because of the absorptions caused by the miniband transitions. Transmission modulation as large as 250 dB/cm has been obtained for transverse electric polarized light at 780 nm. Similar results will also be obtained for a range of wavelengths ranging from 777 to 810 nm using a titanium-sapphire laser. The signal transmitted out of one of the modulators 12 and 14 corresponds to the weighted input signals according to the equation set forth by Lippmann, referenced earlier.

The active component 18 can also be operated as both a modulator and a detector. That can be accomplished, as shown in FIG. 4, by inserting a large series resistor R in the modulator reverse-bias circuit at a fixed voltage. In that configuration, when the incident light is absorbed by the modulator/detector 18 and a current starts to flow in the circuit, a voltage drop occurs across the resistor R which reduces the voltage across the modulator/detector, making that device transmit more light. If, however, the incident light on the modulator/detector 18 as shown in FIG. 4 is reduced in intensity, the current flowing through the circuit is reduced, since one electron-hole pair is created for every photon absorbed, which reduces the voltage drop across the resistor R and increases it across the device 18, making the device 18 transmit less light.

The change in relative transmission of the device 18 as a function of the relative input intensity is a useful measure of its nonlinear behavior. Using two different reverse-bias voltage/resistor settings, the first with −10 volts and 5 Megohms, and the second with −7 volts and 1 Megohm, the relative transmission changed from 0 to 0.95 for the first configuration, and from 0 to 0.87 for the second one. The modulation depth of this switch 18 is approximately 25 dB. Such results clearly show that the nonlinear behavior can be dynamically adjusted based upon system requirements.

The performance of the 2-to-1 waveguide neuron 10 was tested in the following manner to determine its operability. The nonlinear switch 18 was run with −10 volts and 5 Megohms. The waveguide 10 was set up to test AND logic in which the two sets of weights were selected for different input intensities so that the waveguide device 10 would be on when the total input intensity of both of the lasers 300 and 320 was over a threshold value. Otherwise, the waveguide device 10 was off.

The performance of the 2-to-1 waveguide neuron 10 was found to be very good. A neuron on/off ratio of 2300 was obtained by comparing the results under which an output intensity of 2.3 microwatts was obtained with a neuron "on" signal with no voltage being applied to either of the two modulators 12 or 14. The output intensity obtained from the 2-to-1 waveguide neuron 10 with 0 voltage applied to each of the three active components 12, 14, and 18 was 2.4 microwatts. The ratio of 2300 was obtained by comparing the 2.3 microwatt output obtained under the 0 voltage applied to modulators 12 and 14 conditions as opposed to the application of $-4.25$ volts to the first modulator 12, 0 volts to the second modulator 14, and the same $-10$ volts and 5 Megohms operating conditions for the switch 18. Under that second set of conditions, the output intensity of the device 10 was 1 nanowatt, and the neuron signal was "off".

As will be obvious to those of ordinary skill in the art, the laser diodes 300 and 320 can, of course, be integrated on the chip which carries one or more of the devices 10. The high propagation loss of the molecular beam epitaxially grown material can be reduced by growing the p-doped region in the upper cladding 28 farther back from the core region 22. In that matter, propagation losses of less than 10 dB/cm can be obtained. With such a material, a single lateral-mode rib waveguide as disclosed herein can be designed with a better signal-to-noise ratio.

Due to the relatively large area (4 mm×200 microns) required for the fabrication of each neuron, the packing density of the neurons is not very large. Since small-angle Y-junctions are used, the waveguide needs to be relatively long (about 1.43 mm) in order to provide 50-micron separation between the two legs of the Y or input guides. Also, each modulator 12 and 14 also needs to be relatively long, for that reason as well as to obtain adequate modulation.

In order to reduce the area required for fabrication of each neuron, the whole core 22 can be made up of 100% superlattice material instead of only 20% superlattice material, as shown in FIG. 1. That replacement should increase the modulation and thresholding of the waveguide shown in FIG. 1 by up to a factor of five, which will allow the total device length of the waveguide to be reduced correspondingly. Alternatively, a new compact type of power combiner that utilizes either S-bends or right-angled bends can be fabricated. Obviously, the 2-to-1 neuron architecture disclosed herein can be applied to more comlex neurons, such as 4-to-1 neurons.

Although only a preferred embodiment is specifically illustrated and described herein, it will be appreciated that many modifications and variations of the present invention are possible in light of the above teachings and within the purview of the appended claims without departing from the spirit and intended scope of the invention.

What is claimed is:

1. A method of forming a optoelectronic neural waveguide structure including a p-i-n diode structure, comprising the steps of:
    forming an n-doped buffer layer on a substrate;
    forming a bottom cladding layer on said n-doped buffer layer;
    forming a waveguide core on said bottom cladding layer on a side opposite to said n-doped buffer layer, said waveguide core being formed of undoped material;
    forming an upper cladding layer on said waveguide core on a side opposite to said bottom cladding layer;
    forming a p-doped cap layer on said upper cladding layer;
    forming an electrical contact layer on said cap layer;
    forming a plurality of electrically isolated elements by making a plurality of cuts in said combined cap and electrical layers; and wherein
    said p-doped cap layer is formed into a rib waveguide structure in a Y-junction configuration in which each of said isolated elements forms a part of said Y-junction;
    and further including the step of forming said bottom cladding layer from an n-doped and an undoped region in which said n-doped region abuts said waveguide core whereby a neural network device is formed such that the relative intensities of light energy passing through said waveguide core can be controlled by applying electrical energy to said electrically isolated elements.

2. The method of claim 1, further including the step of forming said top cladding layer from a p-doped and an undoped region in which said undoped region abuts said waveguide core.

3. The method of claim 2, further including the step of forming said waveguide core from a superlattice material.

4. The method of claim 3, wherein said superlattice material is formed from alternate layers of GaAs and $Al_{0.4}Ga_{0.6}As$.

5. The method of claim 1, wherein said n-doped region is formed from n-doped $Al_{0.4}Ga_{0.6}As$ and said undoped region is formed from undoped $Al_{0.4}Ga_{0.6}As$.

6. The method of claim 2, wherein said p-doped region is formed from p-doped $Al_{0.4}Ga_{0.6}As$ and said undoped region is formed from undoped $Al_{0.4}Ga_{0.6}As$.

7. The method of claim 2, wherein said substrate is formed from n+-doped GaAs.

8. An optoelectronic neural waveguide architecture, including at least one optoelectronic neural waveguide structure suitable for connection to other suc structures, said at least one optoelectronic neural waveguide structure including a p-i-n diode structure, comprising:
    an n-doped buffer layer formed on a substrate material;
    a bottom cladding layer formed on said n-doped buffer layer;
    a waveguide core formed on said bottom cladding layer on a side opposite to said n-doped buffer layer, said waveguide core being formed from undoped material;
    an upper cladding layer formed on said waveguide core on a side opposite to said bottom cladding layer;
    a p-doped cap layer formed abutting to said upper cladding layer;
    an electrical contact layer formed on said p-doped cap layer;
    means for electrically isolating said electrical contact and cap layers to form a plurality of electrically isolated such elements of combined electrical and cap layers; and wherein said p-doped cap layer is formed into a rib waveguide structure in a Y-junction configuration in which each of said isolated elements forms a part of said Y-junction; and wherein said bottom cladding layer is formed from an n-doped and an undoped region in which said n-doped region abuts said waveguide core;

whereby at least one neural network device is formed such that the relative intensities of light energy passing through the waveguide core of said at least one neural network device can be controlled by applying electrical energy to said electrically isolated elements.

9. The waveguide architecture of claim 8, wherein said top cladding layer is formed from a p-doped and an undoped region in which said undoped region abuts said waveguide core.

10. The waveguide architecture of claim 9, wherein said core is formed from a superlattice material.

11. The waveguide architecture of claim 10, wherein said superlattice material is formed from alternate layers of GaAs and $Al_{0.4}Ga_{0.6}As$.

12. The waveguide architecture of claim 8, wherein said n-doped region is formed from n-doped $Al_{0.4}Ga_{0.6}As$ and said undoped region is formed from undoped $Al_{0.4}Ga_{0.6}As$.

13. The waveguide architecture of claim 8, wherein said p-doped region is formed from p-doped $Al_{0.4}Ga_{0.6}As$ and said undoped region is formed from undoped $Al_{0.4}Ga_{0.6}$.

14. The waveguide architecture of claim 9, wherein said substrate is formed from $n^+$-doped GaAs.

* * * * *